(12) United States Patent
Marr et al.

(10) Patent No.: US 9,281,820 B2
(45) Date of Patent: Mar. 8, 2016

(54) MINIMIZING POWER CONSUMPTION IN ASYNCHRONOUS DATAFLOW ARCHITECTURES

(71) Applicant: Raytheon Company, Waltham, MA (US)

(72) Inventors: Harry Marr, Manhattan Beach, CA (US); Kenneth E. Prager, Granite Bay, CA (US); Julia Karl, Princeton, NJ (US); Lloyd J. Lewins, Marina Del Ray, CA (US)

(73) Assignee: RAYTHEON COMPANY, Waltham, MA (US)

( * ) Notice: Subject to any disclaimer, the term of this patent is extended or adjusted under 35 U.S.C. 154(b) by 390 days.

(21) Appl. No.: 13/782,546

(22) Filed: Mar. 1, 2013

(65) Prior Publication Data

US 2014/0250313 A1    Sep. 4, 2014

(51) Int. Cl.
  *G06F 7/57*    (2006.01)
  *H03K 19/096*    (2006.01)
(52) U.S. Cl.
  CPC ............... *H03K 19/096* (2013.01); *G06F 7/57* (2013.01)
(58) Field of Classification Search
  CPC ....... H03K 19/096; G06F 7/57; G06F 1/3203; G06F 9/3867; G06F 9/3871
  See application file for complete search history.

(56) References Cited

U.S. PATENT DOCUMENTS

| | | | |
|---|---|---|---|
| 5,553,276 A | 9/1996 | Dean | |
| 5,574,925 A | 11/1996 | Paver | |
| 5,918,042 A | 6/1999 | Furber | |
| 6,041,337 A | 3/2000 | Whittaker | |
| 6,225,827 B1 | 5/2001 | Fujii et al. | |
| 6,239,622 B1 * | 5/2001 | Harris | 326/98 |

(Continued)

FOREIGN PATENT DOCUMENTS

| | | |
|---|---|---|
| EP | 0549052 A2 | 6/1993 |
| WO | 9611530 A1 | 4/1996 |
| WO | 2012008928 A1 | 1/2012 |

OTHER PUBLICATIONS

Marr, et al, "An Asynchronously Embedded Datapath for Performance Acceleration and Energy Efficiency," IEEE International Symposium on Circuits and Systems, May 24-27 2009, pp. 1-4.

(Continued)

*Primary Examiner* — Jaweed A Abbaszadeh
*Assistant Examiner* — Brian J Corcoran
(74) *Attorney, Agent, or Firm* — Cantor Colburn LLP

(57) ABSTRACT

An asynchronous pipeline structure includes a plurality of functional blocks comprising dynamic logic, each block precharged to an idle state responsive to a precharge control signal applied thereto, with each block, upon being precharged, receiving input data thereto for processing, and holding output data generated thereby during an evaluate phase, independent of a reset of the input data; for each block, a completion detector circuit coupled to the output of the functional block, the completion detector circuit generating an acknowledgement signal that indicates validity or absence of data at the output of the block; and for each block, a precharge control circuit generating a precharge signal, wherein for a given block, a first input to the precharge control circuit comprises the acknowledgment signal from a downstream completion detector, and second input to the precharge control circuit comprises the precharge signal from an upstream precharge control circuit.

6 Claims, 13 Drawing Sheets

(56) References Cited

U.S. PATENT DOCUMENTS

| | | |
|---|---|---|
| 6,590,424 B2 | 7/2003 | Singh et al. |
| 7,053,665 B2 | 5/2006 | Singh et al. |
| 2002/0053038 A1 | 5/2002 | Buyuktosunoglu et al. |
| 2002/0167337 A1 | 11/2002 | Chelcea et al. |
| 2004/0068640 A1 | 4/2004 | Jacobson et al. |
| 2005/0077918 A1 | 4/2005 | Teifel et al. |
| 2006/0202714 A1 | 9/2006 | Hoang et al. |
| 2009/0070549 A1 | 3/2009 | Solomon |
| 2009/0115469 A1 | 5/2009 | Cortadella et al. |
| 2009/0161428 A1 | 6/2009 | Unger |
| 2010/0309034 A1 | 12/2010 | Ohyama et al. |
| 2011/0029941 A1 | 2/2011 | Dimou et al. |
| 2011/0095803 A1 | 4/2011 | Meijer et al. |
| 2011/0126056 A1 | 5/2011 | Kelleher et al. |
| 2012/0025868 A1 | 2/2012 | Gershenfeld et al. |
| 2012/0303932 A1 | 11/2012 | Farabet et al. |
| 2013/0113522 A1 | 5/2013 | Chang et al. |
| 2014/0232432 A1* | 8/2014 | Fish et al. ............. 326/104 |

OTHER PUBLICATIONS

Bo Marr, et al., "Scaling Energy Per Operation via an Asynchronous Pipeline," IEEE Transactions on Very Large Scale Integration (VLSI) systems, vol. 21, Issue 1, Jan. 2013, pp. 1-5.

Montek Singh, et al., "High-Throughput Asynchronous Pipelines for Fine-Grain Dynamic Datapaths," In proceedings of the International Symposium on Advanced Research in Asynchronous Circuits and Systems, 2000, pp. 1-12.

Ted Eugene Williams,"Self-timed Rings and Their Application to Division," A Dissertation ; Stanford University, May 1991, pp. 1-157.

Prager, et al., "World's First Polymorphic Computer—MONARCH," In 11th Annual High Performance Embedded Computing (HPEC) Workshop, 2007, 1 page.

PCT International Search Report and Written Opinion; International Application No. PCT/US2014/011752; International Filing Date: Jan. 16, 2014; Date of Mailing: Jun. 6, 2014, pp. 1-12.

PCT International Search Report and Written Opinion; International Application No. PCT/US2014/011755; International Filing Date: Jan. 16, 2014; Date of Mailing: Jun. 10, 2014, pp. 1-15.

* cited by examiner

MINIMIZING POWER CONSUMPTION IN ASYNCHRONOUS DATAFLOW ARCHITECTURES

BACKGROUND

The present disclosure relates generally to pipeline processing of digital circuits and, more particularly, to methods and devices for minimizing power consumption in asynchronous dataflow architectures.

Current embedded computing systems have power efficiencies in the neighborhood of around 1-10 billion floating point operations per second (GFLOPS) per Watt. However, for future applications it is anticipated that desired computational capabilities will require at least 50 GFLOPS per Watt, and perhaps as much as 75 GFLOPS per Watt will be necessary in the near future.

In the past, at future sizes larger than 45 nm, computer architects could rely on increased computing performance with each processor generation. This was in accordance with both Moore's law (which resulted in a doubling of the number of transistors in each new generation) and Dennard's law (which resulted in increasing clock speeds by about 40 percent for each new generation without increasing power density). This scaling had previously allowed for increased performance without the penalty of increased power. In other words, the power per unit area (power density) had remained constant.

More recently however, Dennard's law has broken down and clock speed scaling with respect to constant power density has not held. Consequently, each recent generation of chip technology that has experienced increasing number of transistors (due to the continuation of Moore's Law) now comes with the cost of increased power (due to the breakdown of Dennard's law). This in turn has caused power efficiency to reach a limit of about 10 GFLOPS per Watt. Thus, recent and future applications that need lower size, weight, and power (SWaP) will need efficiencies beyond this limit in order to fulfill their mission needs.

Existing, solutions to the performance scaling problem have focused on various areas, including for example: (1) chip multiprocessors, (2) voltage scaling, (3) exploration of other energy-barrier devices, and (4) asynchronous or clockless techniques. These different approaches have both advantages and disadvantages associated with each. In the case of multicore processors or chip multiprocessors, the addition of more processors certainly increases chip performance. However, unless the power consumed per instruction is reduced, there will still be an increase in power density. In addition, multicore processors have proved to be very difficult to program and have failed to reach their utilization potential.

Dataflow based approaches are very effective for problems that can be laid out in a parallel manner. This approach localizes data movements and nearly eliminates all memory traffic not required for algorithmic-temporal purposes. Both FPGAs and other alternative architectures have been developed that combine a large number processing elements cross-connected with high-speed data paths. They offer the ability to perform parallel operations without constantly returning data to storage locations. Alternative reconfigurable architectures based on a word-level self-synchronized dataflow have been shown to have 10× power efficiency improvement for PO and RE DoD missions, when compared to conventional processors (see, e.g., Prager, et al., "World's First Polymorphic Computer—MONARCH," in 11th Annual High Performance Embedded Computing (HPEC) Workshop, 2007.)

Recent Raytheon research into advanced reconfigurable approaches consider the close, binding of the dataflow synchronization with asynchronous logic and voltage scaling logic to get an additional 100× power advantage. In this approach, as data arrives at the cell, a regulator increases supply voltage to accelerate the operation. However, as the output queue fills, the regulator reduces voltage to reduce power when downstream elements cannot use the results. Thus power is automatically reduced to the lowest possible level for the input data rates and processing algorithms. Leakage power is reduced through the reduced voltages as well. Resilience to semiconductor performance variations due to doping or voltage is an additional benefit achieved by the asynchronous timing and local voltage regulation, allowing chips or portions of a chip to run as fast as possible and also slow producing power if other parts of the chip cannot sustain the higher speed (see, e.g., Marr, et al, "An Asynchronously Embedded Datapath for Performance Acceleration and Energy Efficiency," in Proceedings of the International Symposium on Circuits and Systems, 2012.)

SUMMARY

In an exemplary embodiment, an asynchronous pipeline structure includes a plurality of functional blocks comprising dynamic logic, each functional block configured to be precharged to an idle state responsive to a precharge control signal applied thereto, with each functional block further configured to, upon being precharged, receive input data thereto for processing, and each functional block configured to hold output data generated thereby during an evaluate phase, independent of a reset of the input data; for each functional block, a completion detector circuit coupled to the output of the functional block, the completion detector circuit configured to generate an acknowledgement signal that indicates validity or absence of data at the output of the functional block; and for each functional block, a precharge control circuit configured to generate a precharge signal, wherein for a given functional block, a first input to the precharge control circuit comprises the acknowledgment signal from a downstream completion detector, and second input to the precharge control circuit comprises the precharge signal from an upstream precharge control circuit.

In another embodiment, an asynchronous pipeline structure includes a plurality of pipeline stages each including a functional block comprising dynamic logic, each functional block configured to be precharged to an idle state responsive to a precharge control signal applied thereto, with each functional block further configured to, upon being precharged, receive input data thereto for processing, and each functional block configured to hold output data generated thereby during an evaluate phase, independent of a reset of the input data; a fork circuit coupled between an output of a first of the functional blocks and inputs of a second functional block and a third functional block, the second and third functional blocks being disposed in parallel data branches with respect to one another; wherein the fork circuit is configured to, upon a stall condition in a first of the parallel data branches, delay data processing in a second of the parallel data branches until the stall condition is cleared.

In another embodiment, an asynchronous pipeline structure includes a plurality of functional blocks comprising dynamic logic, each functional block configured to be precharged to an idle state responsive to a precharge control signal applied thereto, with each functional block further configured to, upon being precharged, receive input data thereto for processing, and each functional block configured to hold output data generated thereby during an evaluate phase, independent of a reset of the input data; for each functional block, a completion detector circuit coupled to the output of the functional block, the completion detector circuit configured to generate an acknowledgement signal that indicates validity or absence of data at the output of the functional block; and a delay element configured between a first of the functional blocks and a second of the functional blocks, the delay element also having a completion detector circuit coupled to an output thereof, wherein the completion detector circuit of the delay element generates a precharge control signal for the first functional block and the completion detector of the second functional block generates a precharge control signal for the delay element.

In another embodiment, an asynchronous pipeline structure includes a plurality of pipeline stages each including a functional block comprising dynamic logic, each functional block configured to be precharged to an idle state responsive to a precharge control signal applied thereto, with each functional block further configured to, upon being precharged, receive input data thereto for processing, and each functional block configured to hold output data generated thereby during an evaluate phase, independent of a reset of the input data; for each functional block, a completion detector circuit coupled to the output of the functional block, the completion detector circuit configured to generate an acknowledgement signal that indicates validity or absence of data at the output of the functional block; and at least one of the functional blocks comprising a semi-controlled digital circuit such that the digital circuit comprises only one of a header transistor or a footer transistor as a gate device.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

Figure 1A:
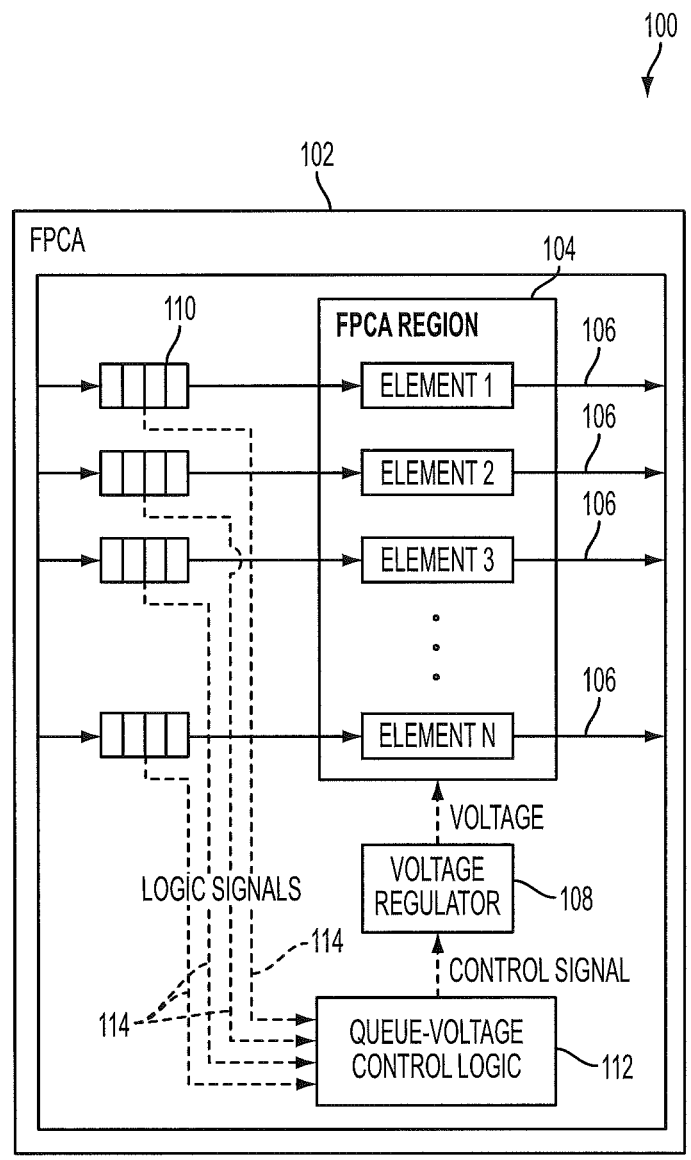
FIG. 1(a) is a schematic block diagram of an exemplary dataflow architecture for digital signal processing in accordance with a coarse grain embodiment.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature(s) being described. Also, the description is not to be considered as limiting the scope of the embodiments described herein.

As indicated above, for field effect transistor (FET)-based circuits used to implement digital signal processing algorithms, scaling laws have previously allowed for an increase in the number of transistors per chip, at constant power. That is, the power per unit area (power density) has remained constant. More recently, for each new generation of chip technology, an increase in the number of transistors comes with the cost of increased power, given an increase in clock speeds.

Existing solutions to the performance scaling problem have focused on various areas, including for example: (1) chip multiprocessors, (2) voltage scaling, (3) exploration of other energy-barrier devices, and (4) asynchronous or clockless techniques. These different approaches have both advantages and disadvantages associated therewith. In the case of multicore processors or chip multiprocessors, the addition of more processors certainly increases chip performance. However, unless each the power consumed per instruction is reduced, there will still be an increase in power density. In addition, multicore processors have proven to be difficult to program and have failed to reach their utilization potential.

One of the ways to reduce the power consumed per instruction in a device is to reduce the voltage used by that device. Leakage current is the amount of current that flows through a transistor when the transistor is in its off state. While an ideal device would have zero leakage current, in reality leakage current has been increasing as device geometries have decreased. This increase in leakage current results in threshold voltages to stop scaling, which in turn causes supply voltages to stop scaling. Consequently, the lack of voltage scaling leads to an increase in the power consumed per instruction.

A possible solution to the leakage current problem is the use of other device types. While this is an ongoing area of research, a suitable replacement for CMOS technology is not currently available. Another area of research is in the use of asynchronous or "clockless" circuit design techniques. The use of these techniques can result in an increase in operating speed while simultaneously reducing leakage energy and dynamic energy, thereby resulting in a net decrease in power consumed per instruction.

The embodiments described herein focus on a combination of multiprocessors, voltage scaling, and asynchronous design to create a dataflow processor that can be programmed to reach high levels of utilization. The use of improved asynchronous techniques results in digital computer circuits that run faster, and with less leakage current. Moreover, asynchronous techniques are also well suited to operate at near-threshold voltage levels, resulting in a further reduction in power consumption. It will be appreciated that the embodiments described herein are applicable to programmable processors as well as application specific integrated circuits (ASICs). Through the use of two relatively new approaches for the implementation of low power digital electronics (asynchronous circuit design and near-threshold voltage (NVT) operating levels), power consumption in these devices may be reduced by a factor of about 10-100× over classic CMOS designs.

Typically, both programmable processors and ASICs are designed using synchronous (i.e., clocked) techniques. Such synchronous circuits run slower since the clock speed is limited by the longest timing path. Clock skew due to transmission line effects and capacitive loading must also be accounted for by lengthening the clock period. Further, the use of explicit registers and latches within a synchronous data pipeline adds to latency overhead. In terms of power operating levels, supply voltages must operate at levels well above transistor device voltage threshold in order to provide sufficient noise immunity. Since dynamic (active) power is a function of voltage squared ($V^2$), higher supply voltages result in higher power consumption. On the other hand, asynchronous digital dataflow logic is clockless and eliminates critical path delays using single-gate-delay technology. Single-gate cells self-time pipeline stages, thereby eliminating clock-tree power, setup and hold times, timing margin, and critical path delays, all while allowing operation at near-threshold voltages, resulting in much lower power consumption. In these circuits, the operating clock speed is a function of the supply voltage, which in turn drives power consumption. Here, the goal is to set the operating voltage such that the circuit runs fast enough to process the input data, but not so fast such that power is wasted.

In asynchronous circuits, clock speed is related to supply voltage. By turning the voltage up the circuit runs faster (i.e., runs at a higher clock speed), and by turning the voltage down the circuit runs slower (i.e., runs at a lower clock speed). In most implementations of computers, intrinsic clock speed of the processor is independent of the arrival rate of data. If they are matched then the processor is optimal. However, if they are mismatched then either the processor is running too fast and waiting for data, or the processor is running too slow and data has to be slowed down or is lost. In the present embodiments, the close coupling between voltage and clock rate is exploited in asynchronous circuits to measure the arrival rate of the data, which in turn is used to control the voltage, and hence the clock rate. An advantage and primary reason for doing this is to save power through optimal use of the processing circuit.

The supply voltage is locally controlled based on dataflow queue load. This ensures that voltage adaptively scales in the range from peak efficiency to peak throughput, considering data input rates, temperature, and semiconductor process variations. Information from the dataflow queues is used to control the voltage regulators, which in turn adjust the local supply voltage (more data queued results in higher voltage and hence faster operating speed). Computations go faster or slower at the minimum power to keep up with work.

Referring to FIG. 1(a), there is shown a schematic block diagram of an exemplary dataflow architecture 100 for digital signal processing in accordance with a coarse grain embodiment. In the embodiment depicted, the architecture 100 includes a digital circuit device 102, such as a field programmable compute array (FPCA). An FPCA is a reconfigurable IP core that may be used for performing both single and multi-operand operations such as, but not limited to: arithmetic, logical, memory, and multiplication operations, which occur in applications such as video coding, finite impulse response (FIR) filters, and 3G wireless base station channel cards. It should be appreciated, however, that other types of digital circuits are also contemplated.

In any case, the digital circuit device 102 includes a plurality of parallel elements making up a FPCA Region 104 for processing digital data, designated in FIG. 1(a) as Element 1, Element 2, etc. Each element in 104 produces one or more outputs, for example 106, which outputs may be used by other processing devices (not shown). A voltage regulator 108 delivers a common operating voltage for the group of elements within the FPCA Region 104. The voltage regulator 108 may or may not be included on a common substrate or chip with respect to the digital circuit device 102.

In accordance with an embodiment herein, queue loading of the dataflow elements 110 in each FPCA Region 104 is used to set the local cluster supply voltage thereto, and thereby the operation speed. Control logic 112 within the architecture receives a plurality of (positive) feedback signals 114 for each element, which signals are indicative of the rate at which data is moving through each individual element. For this embodiment, it is assumed that the different elements perform related operations that data moves at common rates, thus only a single, common voltage is supplied.

Thus, for a given set of elements in the FPCA Region 104 that are taxed less, the voltage supplied to the elements may be reduced since they do not need to compute as quickly. As a result, less power may be used without compromising the speed of the system as a whole. Thus, for the example illustrated, the control logic 112 may communicate via a control signal with the voltage regulator 108 so as to cause the voltage regulator to adjust the output supply voltage to all of the elements in the FPCA Region. Conversely, where the elements are taxed more heavily, the supply voltage thereto (and therefore speed) is increased to keep up with the workload.

Figure 1B:
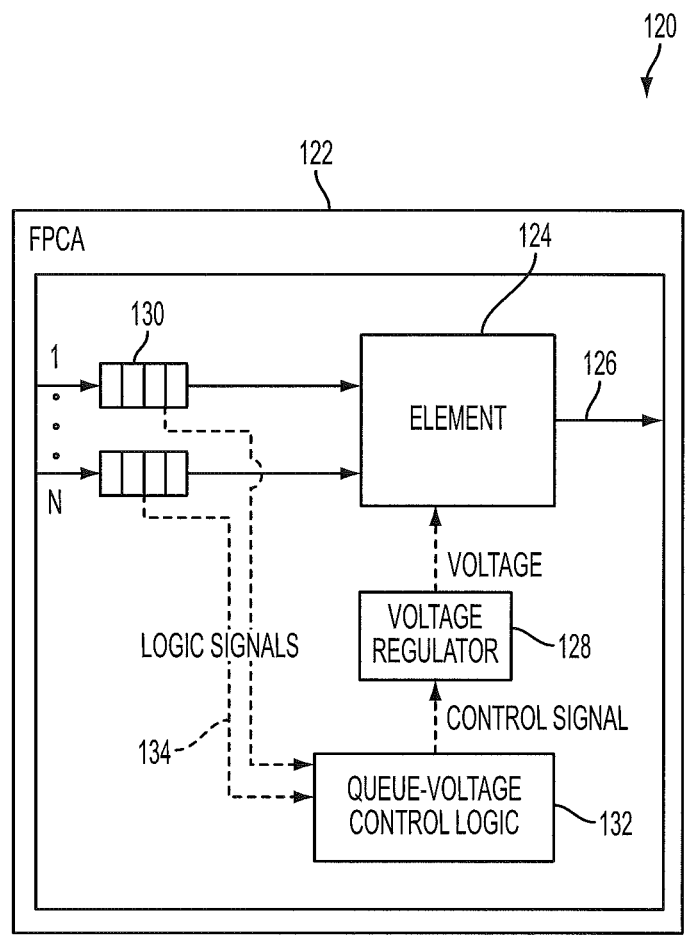
FIG. 1(b) is a schematic block diagram of an exemplary dataflow architecture for digital signal processing in accordance with a fine grain embodiment.

Referring now to FIG. 1(b), there is shown a schematic block diagram of an exemplary dataflow architecture 120 for digital signal processing in accordance with a fine grain embodiment. In the embodiment depicted, the architecture 120 includes a digital circuit device 122 that may be used for performing both single and multi-operand operations such as but not limited to arithmetic, logical, memory, and multiplication operations. In any case, the digital circuit device 122 includes a single element 124 for processing digital data. The element 124 produces an output(s) 126 which may be used by other processing devices (not shown). A voltage regulator 128 delivers a common operating voltage for the element 124. The voltage regulator 128 may or may not be included on a common substrate or chip with respect to the digital circuit device 122.

In accordance with an embodiment herein, queue loading of a plurality of parallel dataflow elements 130 is used to set the local cluster supply voltage thereto, and thereby the operation speed. Control logic 132 receives a plurality of (positive) feedback signals 134 for each of the plurality of parallel dataflow elements, which signals are indicative of the rate at which data is moving through the element.

Figure 1C:
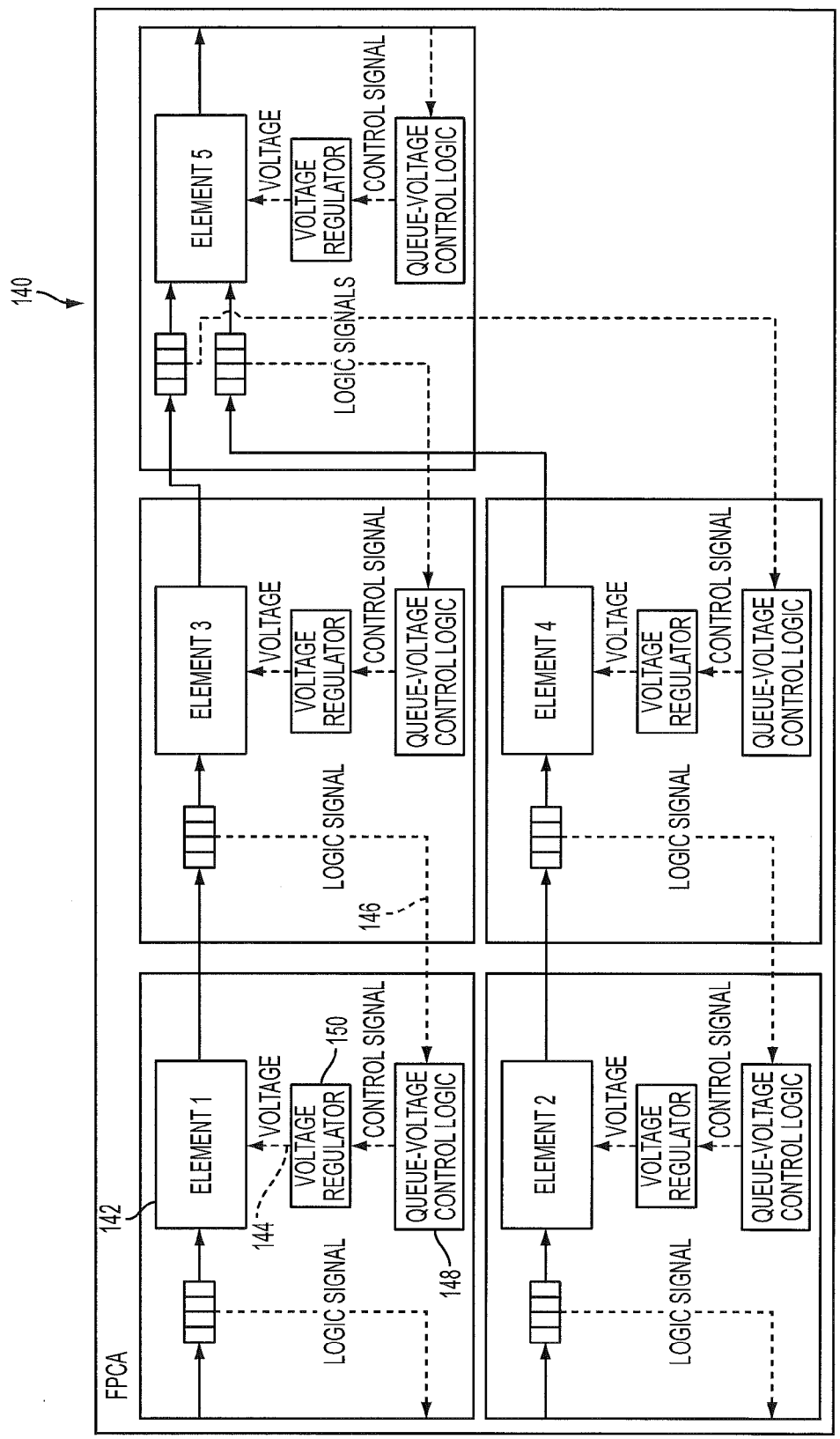
FIG. 1(c) is a schematic block diagram of a set of fine grain elements connected in a parallel fashion.

Referring to FIG. 1(c), there is shown a schematic block diagram 140 of a set of fine grain elements connected in a parallel fashion. Because the different elements perform different operations, it follows that data moves at different rates. Thus, for a given element (e.g., Element 1) 142 that is taxed less with respect to other elements, the individual voltage 144 supplied to that element may be reduced since it does not need to compute as quickly as the more heavily taxed elements. As a result, less power may be used without compromising the speed of the system as a whole. Thus, for the example illustrated, where Element 1 is used less heavily than others (as reflected by (negative) feedback signal 146), the control logic 148 may communicate via a control signal with the voltage regulator 150 so as to cause the voltage regulator to reduce the output supply voltage 144 to the element 142. Conversely, where an element is taxed more heavily, the individual supply voltage thereto (and therefore speed) is increased to keep up with the workload.

It will be appreciated that both the coarse (set of elements) and fine grain (single element) dataflow architectures depicted in FIGS. 1(a)-1(c) may use either positive feedback, negative feedback, or a combination thereof. Moreover, the technique is also applicable to a synchronous (clocked) circuit version. Here, additional logic may be needed to separately control both the frequency and the voltage.

As discussed above, the use of asynchronous circuit design techniques may also result in an increase in operating speed while simultaneously reducing leakage energy and dynamic energy, thereby resulting in a net decrease in power consumed per instruction. By way of background, an asynchronous pipeline structure 200 developed by Ted E. Williams (*Self-Timed Rings and Their Application to Division*, Ph.D. Thesis, Stanford University, June 1991) is illustrated in FIG. 2.

The pipeline structure 200 is a dual-rail design, in which two wires (rails) are used to implement each bit of data. In particular, each bit of binary data is encoded as a pair of logic states on the two rails as: "idle" (00), i.e., where a first one of the two rails is a logic 0 and the second one of the pair of rails is a logic 0; a "logical 0" (01), i.e., where the first one of the two rails is a logic 0 and the second one of the pair of rails is a logic 1; and "logical 1" (10), i.e., where a first one of the two rails is a logic 1 and the second one of the pair of rails is a logic 0. It is noted that the encoding (11) is an invalid state.

Within the pipeline structure 200 are included a plurality of functional blocks 202a, 202b, 202c, that employ dynamic logic. Thus, each functional block 202a-c is reset or precharged to the idle state before it is used every cycle, as indicated by the (active low) control signal "pc". Once precharged, a functional block 202a-c is armed and ready to receive data; as soon as the input changes to a logical value (either 0 or 1), that input is effectively captured. The capture can only occur once per cycle, i.e., the first valid value is captured. Since the precharged functional blocks 202a-c can hold its own data outputs even when the inputs are reset to "idle", the blocks provide the functionality of an implicit latch even though an explicit latch need not be provided in the pipeline stage.

Figure 2:
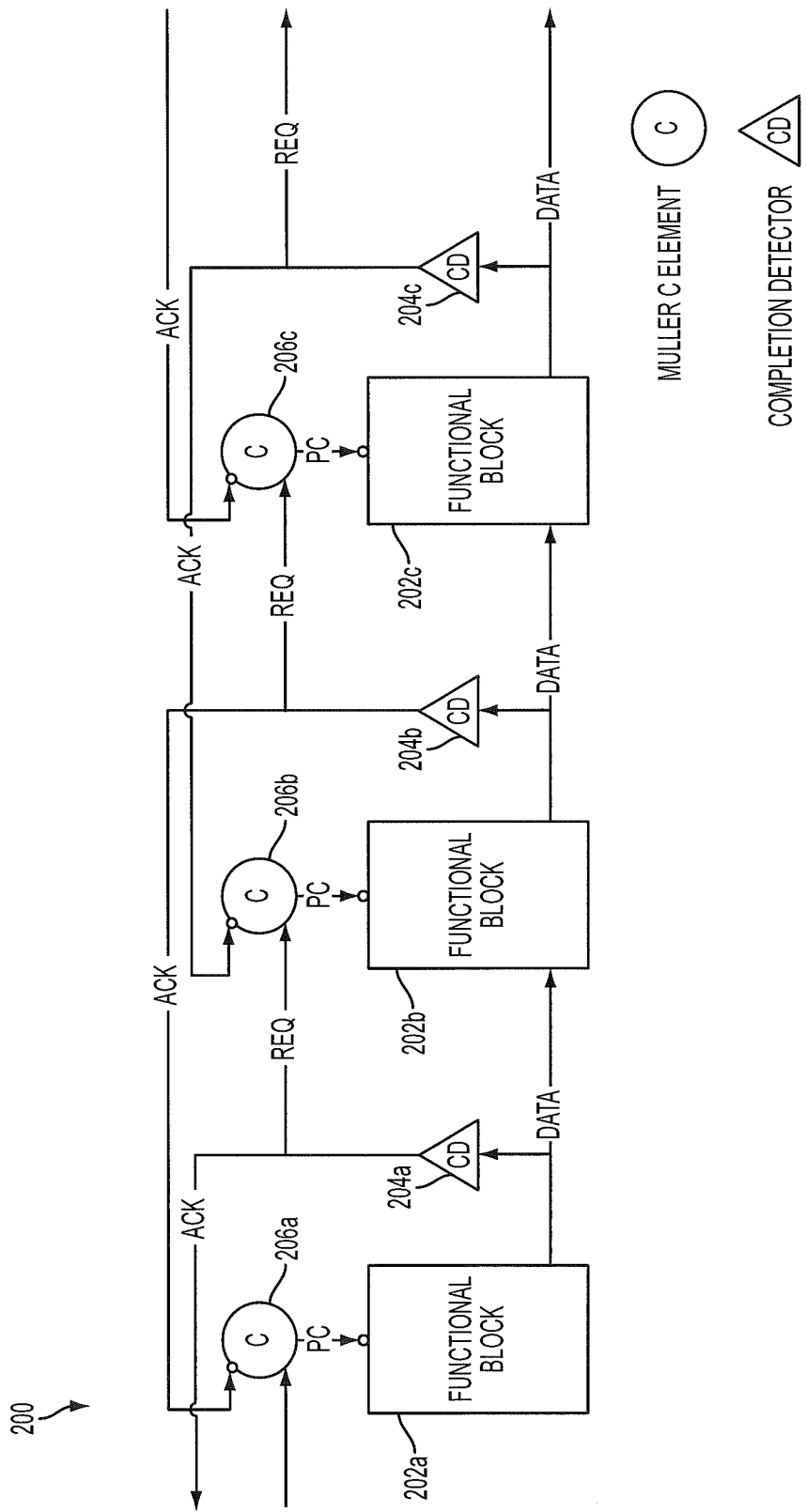
FIG. 2 is a schematic diagram of an existing asynchronous pipeline structure.

As further depicted in FIG. 2, each stage includes a completion detector (CD) 204a, 204b, 204c, that indicates validity or absence of data at the output of the associated functional block 202a-c, which may be either a fully controlled or a semi-controlled precharged block. A Muller-C element 206a, 206b, 206c, in each stage controls its associated functional block 202 by merging a "go" or "request" signal (req) from the completion detector 204a-c of the preceding stage with a "done" or "acknowledge" signal (ack) from the completion detector 204a-c of following stage. The nomenclature of the pipeline architecture 200 given by Williams (in which the functional blocks 202a-c are controlled by Muller-C elements 206a-c) is PCx, where "x" refers to the number of explicit latches included between functional blocks 202a-c. Here, the architecture is "PC0", since there are no explicit latches present in the pipeline.

Muller-C gates act like a "sticky" AND gate, in that (like a conventional AND gate) the output does not go to '1' until both inputs are '1'. However, the output will then remain at '1' until both inputs are '0'. The completion detectors 204a-c actually use multi-input Muller-C gates (or an equivalent tree of smaller gates). This means that not only does the output of the completion detector 204a-c only go to '1' when all the inputs are valid (either logical 0 or logical 1), but also the output does not revert back to '0' until all the inputs are at the idle encoding.

In a pipeline of functional blocks such as in FIG. 2, two timing issues arise. First, the output of an upstream element (e.g., functional block 202b) must be captured by a downstream element (e.g., functional block 202c) before the upstream element is precharged. Second, the output of an upstream element (e.g., functional block 202b) must either be idle, or changed to its new state before a downstream element (e.g., functional block 202c) exits the precharge state (i.e., precharge is de-asserted). The "ack" signal fed from the completion detector of one stage to the Muller-C element of the previous stage ensures the first condition, since it is only asserted after the downstream element has valid data on all its outputs. That is, the downstream element has captured its inputs as detected by the corresponding completion detector. In PCx style pipelines, the second condition is assured by the "req" signal being de-asserted after the completion detector of the upstream element goes to zero. This indicates that all the outputs of the upstream element have been reset to the idle encoding. Only then can the downstream element enter precharge (which obviously prevents it from exiting precharge before the input is reset).

One issue with PCx configuration pipelines such as shown in FIG. 2 is that the Muller-C elements 206a-c are in the critical path of forward flowing data tokens, since the Muller-C elements transition to remove the precharge signal "pc" only after its functional block has received valid data inputs. Thus, the delay of the upstream completion detector and Muller-C element adds to the delay of the functional block evaluation. Alternatively, a modified asynchronous pipeline architecture was developed by Williams, termed the "PSx" family.

Figure 3:
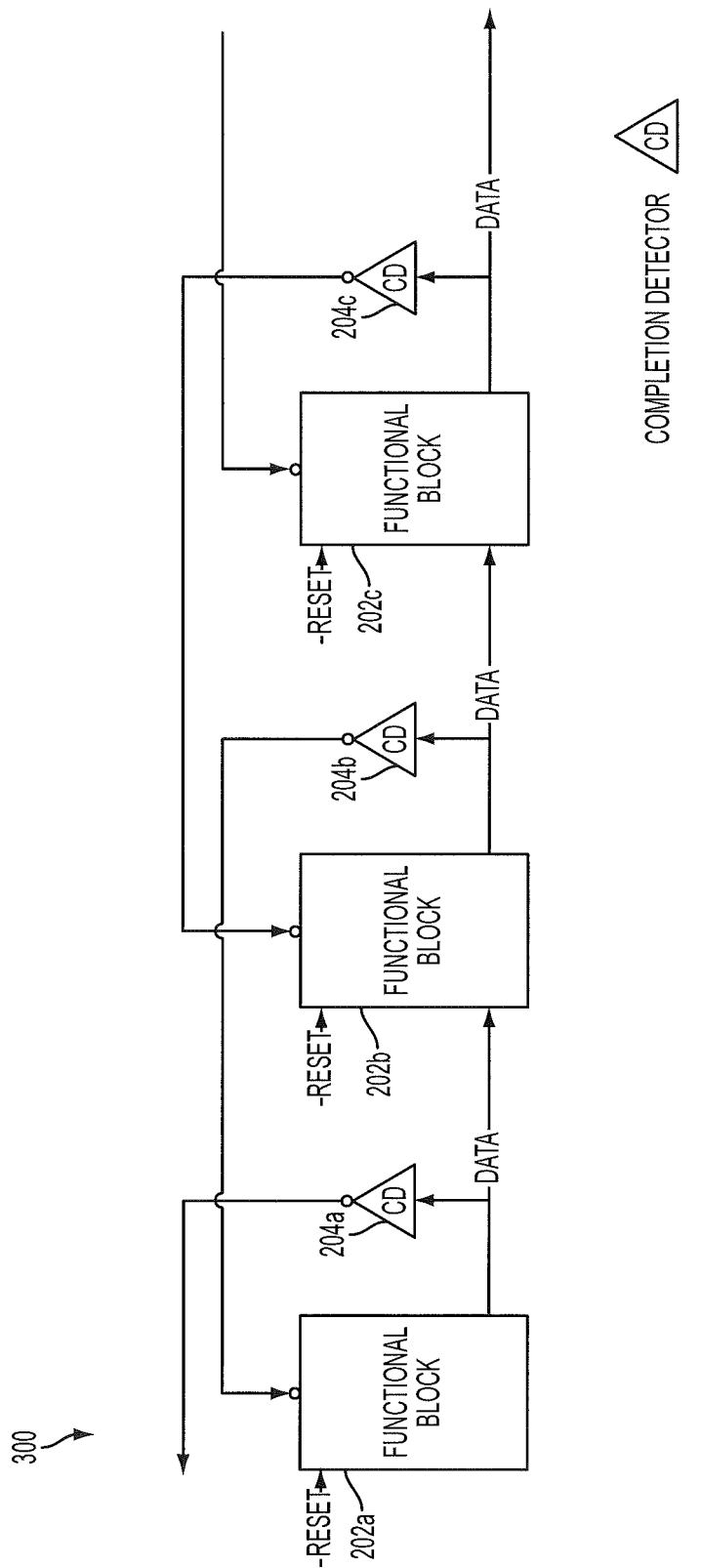
FIG. 3 is a schematic diagram of an existing asynchronous pipeline structure.

As illustrated in FIG. 3, in a PSx style pipeline 300 (also developed by Williams), the Muller-C gates are removed and instead the precharge input for each functional block 202a-c is taken directly from the output of the completion detector 204a-c of the downstream functional block. For example, the output of the completion detector 204b is the precharge input for functional block 202a. For illustrative purposes, a "reset" signal is also depicted for each functional block 202a-c, which causes data in each block to be reset to the "idle" state. A timing assumption of the design in FIG. 3 is that stages pre-charge to "idle" faster than they evaluate. Generally, this timing requirement is easily met in pipelines having similar stages.

However, it has been recognized herein that a problem occurs in such PSx pipelines when there is a fork in the data pipeline structure; i.e., the output of a functional block branches into inputs to two separate downstream function blocks. Typically, the "ack" signals fed from the completion detectors of the two parallel downstream elements from the fork are combined with a Muller-C gate, in turn generating a single "ack" signal for the upstream functional block prior to the fork. It is further recognized herein that this configuration works so long as neither downstream element is indefinitely stalled. However, in a dataflow (i.e., pipeline) machine, downstream elements may be stalled by a variety of causes, including for example recombinant data paths (paths which fork and subsequently merge), external elements, gated elements, etc. If one leg of a fork is stalled, and the other is not, then the non-stalled fork can assert an "ack" signal, and then de-assert it without the upstream element clearing its output (since the upstream "ack" is blocked by the combining Muller-C gate). Moreover, if the upstream element never clears its output data to idle, the elements downstream therefrom will evaluate repeatedly, thus capturing the same frozen value over and over again. In PSx style pipelines (unlike PCx pipelines) there is no interlock which prevents this. Thus, on the one hand a PSx pipeline is faster than a PCx pipeline, but on the other hand, the PCx pipeline does not suffer from the downstream stall of one or more forks as the case for the PSx pipeline.

Figure 4:
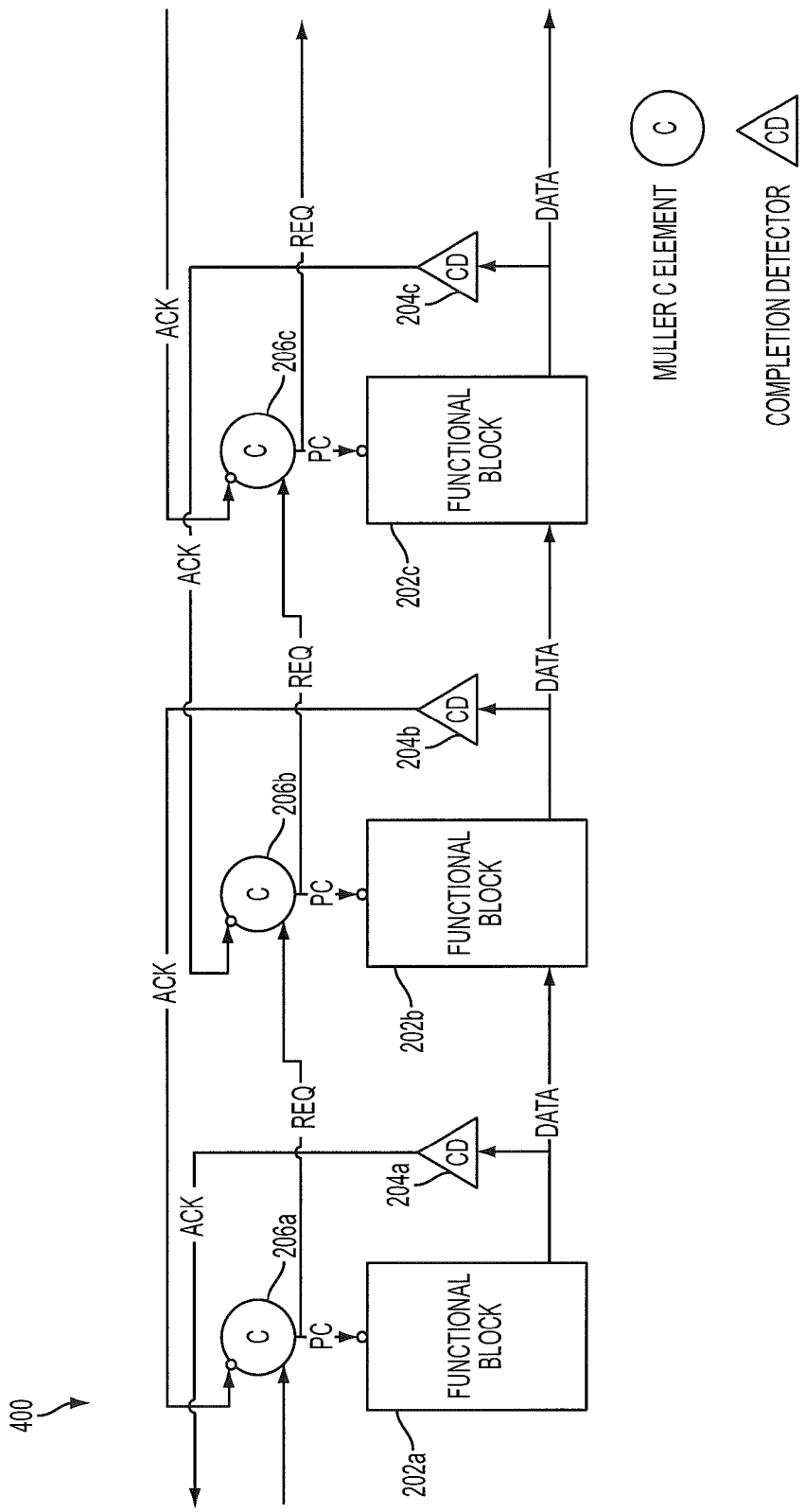
FIG. 4 is a schematic diagram of an asynchronous pipeline structure in accordance with an exemplary embodiment.

Referring now to FIG. 4, there is shown a schematic diagram of a modified PCx pipeline architecture 400, in accordance with an exemplary embodiment. The modified architecture 400 is also referred to as a PCx* architecture herein. In contrast to the existing PCx architecture of FIG. 2, the present PCx* architecture 400 reduces the critical path penalty of the completion detector and Muller-C elements 206a-c by relocating the "req" input signal from a given element to the output of the Muller-C gate of the upstream element, thus bypassing the upstream evaluation and completion detection. Thus, for example, instead of the second input to Muller-C element 206b originating from the output of completion detector 204a of the previous stage, the second input to Muller-C element 206b originates from the output of Muller-C element 206a of the previous stage. The PCx* architecture 400 thus allows for both a forward request and backward acknowledge signal, but takes several gate delays out of the critical path asynchronous cycle time from the previous design.

A further improvement to PCx* can be made by using an "asymmetric" Muller-C gate (see, e.g., Singh and Nowick, "High-Throughput Asynchronous Pipelines for Fine-Grain Dynamic Datapaths") in place of the standard Muller-C gate. Asymmetric C-elements have inputs which only effect the transitioning in one of the directions (0 to 1 or 1 to 0). Depending on the affected transition, they are called either plus input (+) or minus inputs (−). In this case, the Muller-C gate is modified so that its output goes high if the "ack" input goes low, but only goes low if both the "ack" input is high and the "req" input is low. Thus, the circuit acts like PSx on the falling edge of "ack"; it enters the evaluate state immediately without regard to "req". However, on the rising edge of "ack", it will only enter pre-charge if "req" is low (the upstream element has seen the downstream "ack"). This works because only the falling edge of "req" is of concern. For correct fork behavior, the downstream stage needs to be blocked from pre-charging (thus holding "ack" into the fork combining Muller C gate) until req is low (the combined "acks" have been seen). The rising edge of request (entering evaluate) is not important; even if the downstream stage enters evaluate early, nothing will happen until valid data arrives.

Figure 5:
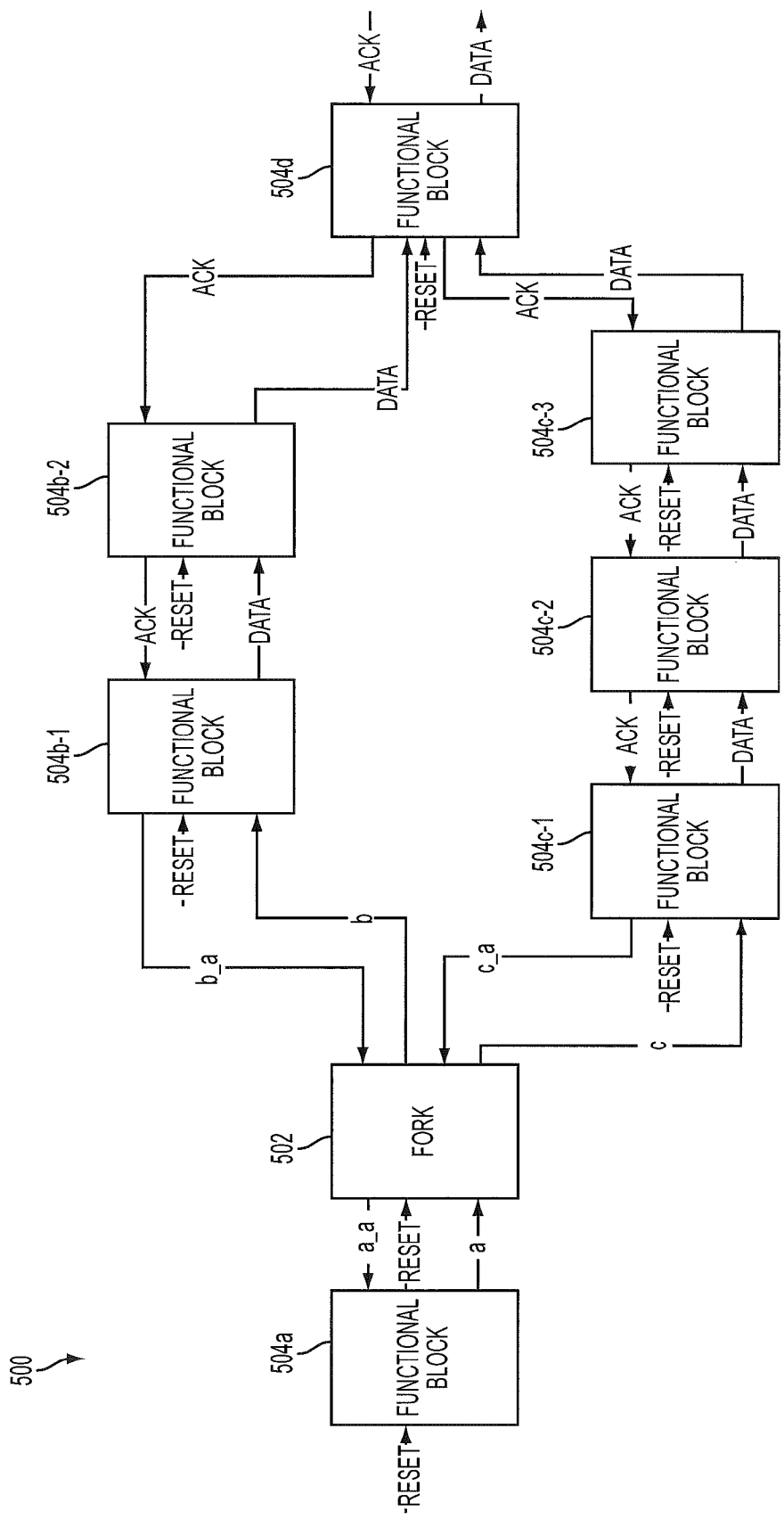
FIG. 5 is a schematic block diagram of an asynchronous pipeline structure having a fork circuit in accordance with an exemplary embodiment.

Notwithstanding the timing improvement offered by the modified PCx* architecture disclosed herein, it is still recognized that PSx style pipelines are inherently faster than PCx* pipelines since they do not have the additional delay of the Muller-C gates. Accordingly, PSx style pipelines would be desirable, provided the fork problem being addressed can be solved. Referring now to FIG. 5, there is shown a schematic diagram of an improved PSx architecture 500 that includes an isochronic dataflow fork circuit 502 disposed between functional blocks 504, upstream of a fork within the dataflow path. More specifically, the fork circuit 502 is disposed downstream from a functional block 504a, after which the datapath branches into a first branch (b) including functional blocks 504b-1 and 504b-2, and a second branch (c) including functional blocks 504c-1, 504c-2 and 504c-3. Output data from the two branches are merged as inputs to functional block 504d. In FIG. 5, the data output from functional block 504a is denoted "a", which data passes through the fork circuit 502 and is then split into "b" for the first branch functional block 504b-1 and "c" for the second branch functional block 504c-1. Further down the pipeline structure, the output data is simply designated as "data".

By way of further convention, the novel acknowledgement signal (described in further detail below) from the fork circuit 502 to functional block 504a is denoted "a_a", while the acknowledgement signals from functional blocks 504b-1 and 504c-1 to the fork circuit 502 is denoted "b_a" and "c_a", respectively. Further down the pipeline structure, the remaining acknowledgement signals are simply designated as "ack".

As indicated above, in a traditional PSx architecture a pipeline stall in one of the branches would not prevent the non-stalled branch from continuing to process data. As a result, the non-stalled branch continues to process incorrect values. In contrast, the fork circuit 502 of the present embodiment prevents this condition by stalling both branches of the fork in the event either branch stalls for some particular reason. The fork circuit does this by effectively having two outputs. One output can remain valid (necessary to drive the input of a stalled element which has not yet confirmed capture of the data by asserting "ack"). The other output can be quickly cleared to idle (necessary to ensure that the element which is not stalled does not immediately start to evaluate stale data from the prior cycle when "ack" is removed).

Figure 6:
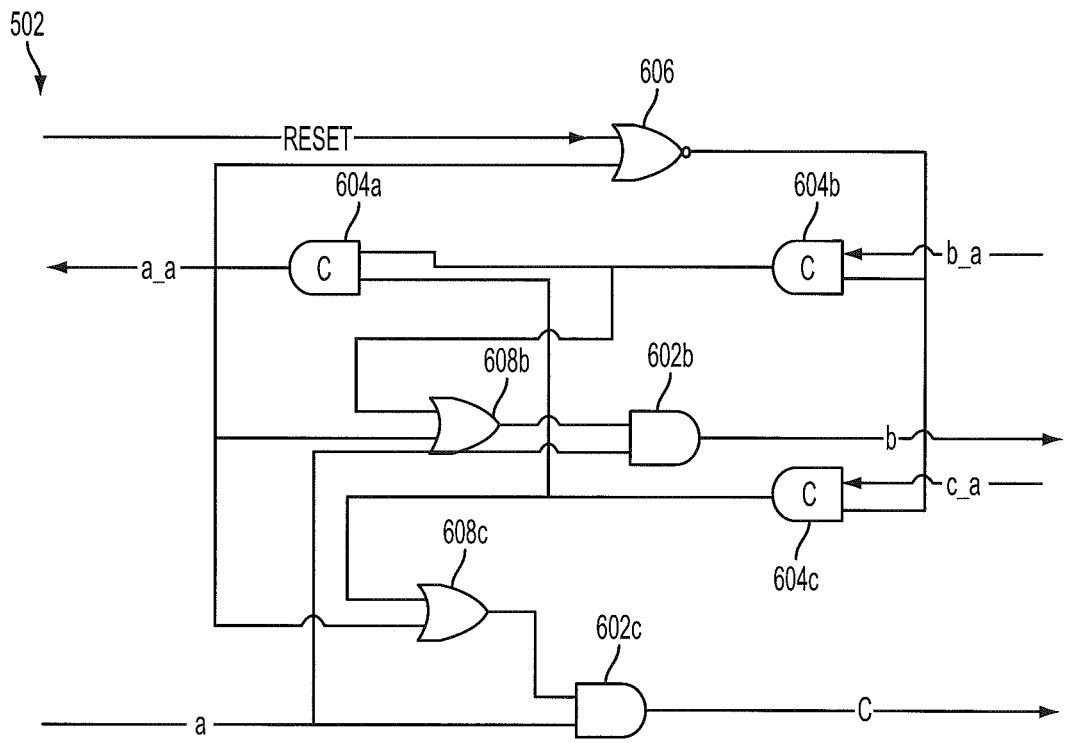
FIG. 6 is a schematic diagram illustrating the fork circuit of FIG. 5 in greater detail.

FIG. 6 is a schematic diagram illustrating the fork circuit 502 of FIG. 5 in greater detail. As is illustrated, the fork circuit 502 includes a pair of bit-sliced AND gates 602b, 602c that receive the input data "a" from the upstream functional block as first inputs thereto (one bit of "a" for each AND gate). It will be recalled that signal "a" is an N bit bus of two-wire signals representing the computed output of the upstream stage. The bit-sliced AND gate contains two N individual AND gates, one for each wire in the N bit bus. The two N wires from the input "a" are wired such that one 2-input AND gate receives one input from a wire in the bus "a", and the output of each AND gate generates the corresponding output bus wire. The other input of the bit-sliced AND gate is tied to the second input of each individual 2-input AND gate. The result is that when the second input is 1, the first input is passed through the bit-sliced AND gate unchanged, but when the second input is 0, the output of the bit-sliced AND gate is driven to the "idle" state. The output of AND gate 602b is the output data "b" sent to the first branch functional block 504b-1 as described above.

Correspondingly, the output of AND gate 602c is the output data "c" sent to the second branch functional block 504c-1 as also described above. The acknowledgement signals "b_a" and "c_a" received by the fork circuit 502 are input to respective first and second Muller-C gates 604b, 604c. A third Muller-C gate 604a receives the outputs of first and second Muller-C gates 604b, 604c as inputs thereto, and generates the combined acknowledgement signal "a_a" sent from the fork circuit 502 back to the functional block 504a of FIG. 5.

As further depicted in FIG. 6, a NOR gate 606 receives a reset signal as a first input thereto, and the combined acknowledgement signal "a_a" as a second input thereto, with the output of the NOR gate 606 (a combined acknowledge signal) serving as the second input to both Muller-C gates 604b and 604c. As stated above, AND gates 602b, 602c respective gate the input fork data "a" as output data "b" and "c" to the respective fork branches. The gating control signals for these gates (i.e., the second input to each bit-sliced AND gate in 602b, 602c) are derived from the outputs of OR gates 608b and 608c, respectively. The input signals to OR gate 608b are the output signals from Mueller-C gate 604b and Muller-C gate 604a. Similarly, the input signals to OR gate 608c are the output signals from Muller-C gate 604c and Muller-C gate 604a.

In operation, the fork circuit 502 allows one sample of data "a" to be delivered to two different locations "b" and "c" successfully. When a downstream element asserts acknowledge (b_a or c_a), the Muller-C gate (604b or 604c respectively) and bit sliced AND gates (602b and 602c respectively) cause the corresponding output ("b" and "c" respectively) to be rapidly driven to the "idle" state (as required for correct operation of the PSx pipeline). This "idle" state is held by the Muller-C gates (604b and 604c) and the feedback through Muller-C gate 604a and NOR gate 606 until both downstream elements have provided an acknowledge, and new data (or the "idle" state) is driven by the upstream element on "a". Even if a downstream element pre-charges and removes its acknowledge (b_a or c_a), the element will not evaluate since its input is held in the "idle" state by the bit-sliced AND gate (602b or 602c). The OR gates 608b and 608c hold the outputs "b" and "c" idle even once both acknowledge signals ("b_a" and "c_a") have been received. This prevents the outputs "b" and "c" reverting to the prior sample driven on "a" before the upstream element has time to react to the combined acknowledge and generate the "idle" state. The NOR gate 606 allows a global reset signal to reset the state of the fork, for example at circuit power-up.

As stated previously, in the prior art the bus "a" is effectively hardwired to buses "b" and "c" (without the bit-slice AND gates 602b and 602c), and the Muller-C gate 604a is used to combine the acknowledges from the downstream elements "b_a" and "c_a" without the Muller-C gates 604b and 604c. If either downstream element is stalled, or even takes longer to evaluate and generate its acknowledge, the other element may precharge and be ready to accept new data before the prior input sample on "a_a" has been updated, or reset to the "idle" state. The above described fork circuit 502 prevents this scenario from happening by delaying data processing in one parallel data branch until the stall condition in the other parallel data branch is cleared.

Figure 7:
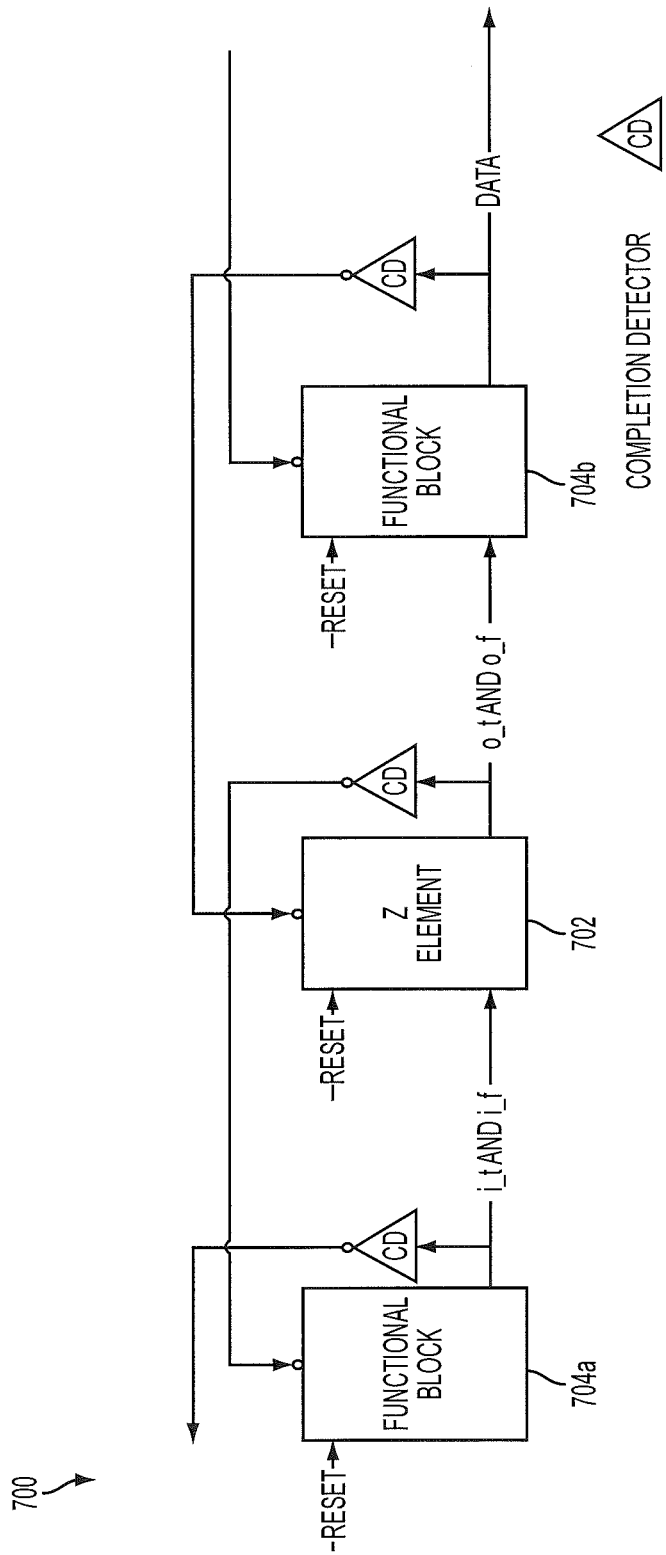
FIG. 7 is a schematic block diagram of an asynchronous pipeline structure having a Z-element type delay element, in accordance with another exemplary embodiment.

Referring now to FIG. 7, there is shown a schematic diagram of an asynchronous pipeline structure 700 having a single cycle Z-element delay element 702 disposed between adjacent functional blocks 704a, 704b, in accordance with another exemplary embodiment.

In a classical clocked system, Z-element delays are implemented using registers (which is particularly simple if the clock is running at the system sample rate). In a synchronous pipeline of three registers, R1, R2 and R3, at reset the registers are cleared to zero. Thus, before the first clock signal, the output of the three registers is {0, 0, 0}. If value I1 is clocked into the pipeline on the first clock signal, the output of the registers will be {I1, 0, 0}. If I2 is clocked into the pipeline on the second clock signal, the output will be {I2, I1, 0}, etc.

On the other hand, an asynchronous system operates differently. After reset, the output of a pipeline of functional units F1, F2 and F3 will be {X, X, X}, meaning the outputs are not zero but idle. In other words, there is no output data after reset. After I1 enters the system, the units will contain {I1, X, X}; then, when I2 enters the system, the units will contain {I2, I1, X}, etc. Thus, to achieve the same effect as a classical clocked system, a "real" value is pre-loaded into the functional units when they are reset, which is what a Z-element may accomplish. Accordingly after reset, the output of a pipeline of Z-elements Z1, Z2, Z3 will be {0, 0, 0}. Then when I1 arrives, the output will be {I1, 0, 0}, etc. If the pipeline contains {0, 0, 0} after reset, then barring a downstream stall, the pipeline can move to {X, 0, 0}, then {X, X, 0} and finally {X, X, X} without any inputs arriving. This is not problematic since the nature of the data flow system causes the zeros to either be correctly used in calculations, or to stall somewhere in the pipeline until any required data is received.

In the example depicted in FIG. 7, the Z-element 702 serves to speed up the pipeline process, even though it is an extra element in the pipeline 700. This aspect is appreciated upon consideration that one stage cannot progress without the acknowledge signal of the stage in front of it. Since the Z-element 702 is a very quick stage, if it is configured between two long stages (e.g., a pair of multipliers) then multiplications operations may essentially be performed in parallel. For example, when a downstream multiplier (e.g., functional block 704b) completes, it sends an acknowledgement signal (via the completion detector) back to the Z-element 702. In turn, the Z-element 702 quickly takes in new data, finishes its operation, and acknowledges back to the upstream multiplier (e.g., functional block 704a). The upstream multiplier begins performing its own computation while the downstream multiplier is also performing a multiplication. This is possible because of the Z-element 702. Without the Z-element 702, the downstream multiplier 704b would acknowledge directly back to the upstream multiplier 704a but have to wait for the upstream multiplier 704a to finish before it could start multiplying again because the data would not be new.

In addition to buffering a data value for an asynchronous timing cycle, the Z-element 702 also has the ability to be initialized to a data value. In normal operation, the Z-element behaves just like an identity element since it provides one asynchronous pipeline delay without modifying the data being passed through. However, after reset, the Z-element 702 is not initialized to the empty state. Instead, it is initialized to hold a logical 0 (for all bits in the bus).

Figure 8:
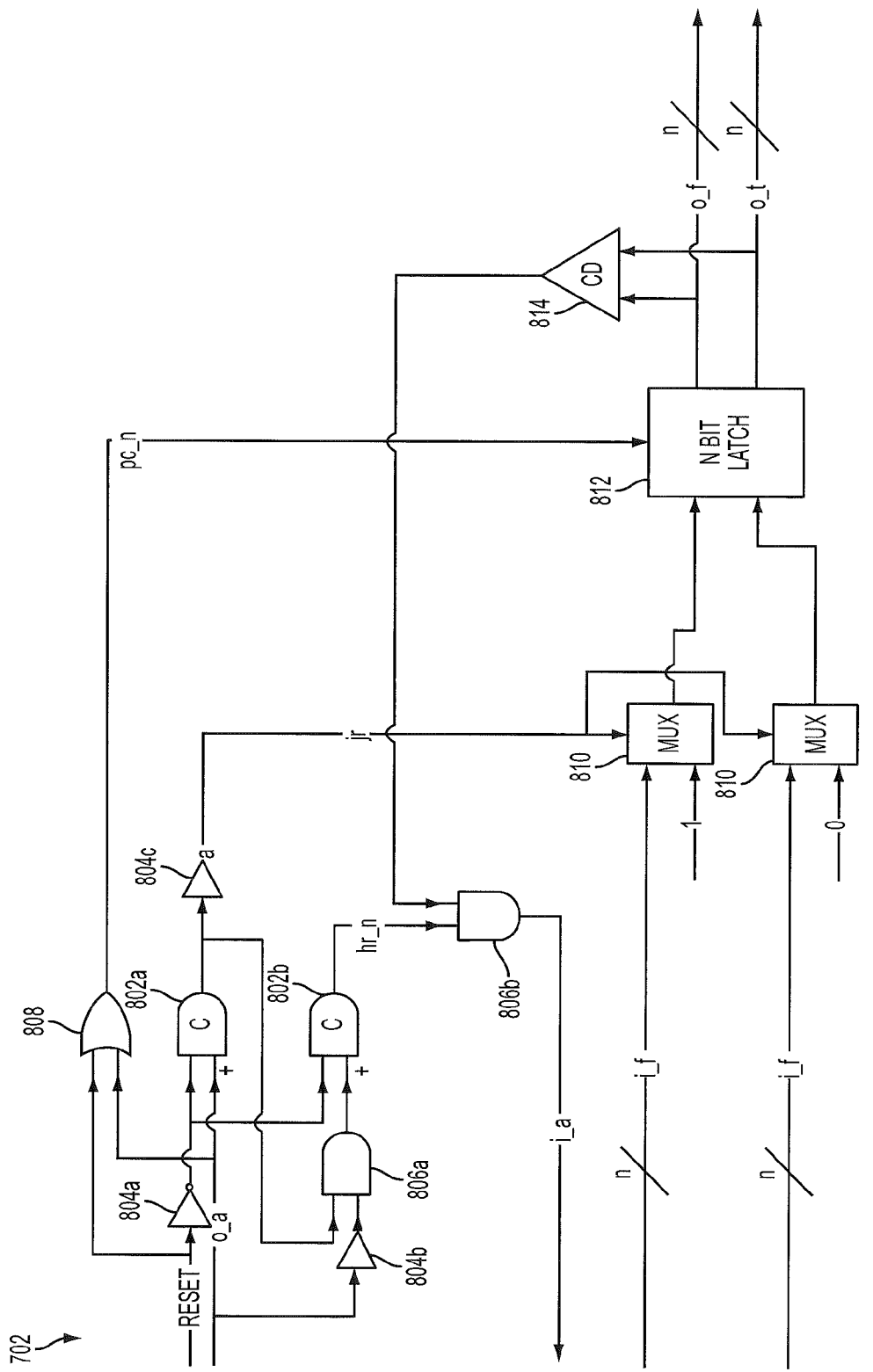
FIG. 8 is a schematic diagram illustrating the Z-element of FIG. 7 in greater detail.

A more detailed schematic of the Z-element 702 is illustrated in FIG. 8. As is shown, the Z-element, 702 includes asymmetric Muller-C gates 802a, 802b, inverters 804a, 804b, 804c, AND gates 806a, 806b, OR gate 808, multiplexer 810, an N bit latch 812 and a completion detector 814.

Upon reset, both Muller-C gates 802a, 802b are reset to '0', so that "hr_n" (hold reset negated) is '0' and "jr" (just reset) is '1'. The reset operation also precharges the N bit asynchronous latch 812. With jr set to '1', the mux 810 selects a logical '0' to be driven into the latch 812 after reset is removed (so that all the bits of O_f will be '1' and all the bits of O_t will be '0'). Thus, after reset, the Z-element is generating a logical '0' value and driving it downstream. It will be noted, however, that since "hr_n" is '0', the output of the completion detector 814 is blocked, and an acknowledge signal (i_a) is not generated upstream. When this value is captured by the downstream element (O_a is driven to '1'), "jr" is cleared to '0' allowing the mux 810 to switch to selecting the inputs ("i_f" and "i_t" for normal operation). In addition, the N bit latch 812 is again pre-charged. It will be noted that "hr_n" is still '0' and still prevents "i_a" from generating an acknowledge signal upstream. When O_a is driven to '0' (i.e., the downstream element is ready to receive new data), pre-charge is removed, and the upstream data (i_f and i_t) is passed thought the N-bit asynchronous latch 812. In addition, hr_n is set to '1' allowing the acknowledge (i_a) generated by the completion detector to be sent to the upstream element.

As the logic in FIG. 8 shows, the reset input, along with O_a, the acknowledgement signal from the next stage, are put through several gates to create a signal "jr" that triggers the Z element to switch the multiplexers (mux). The multiplexer 810 can switch to initialize the latch contained in the Z-element to a logical '0', where a logical '0' is the equivalent of the i_f false line equal to '1' and the i_t true line equal to '0' in dual rail. Otherwise, the latch buffers the incoming data i_f and i_t for one asynchronous cycle and sets the outputs O_f and O_t to the values of i_f and i_t after one asynchronous cycle.

Figure 9:
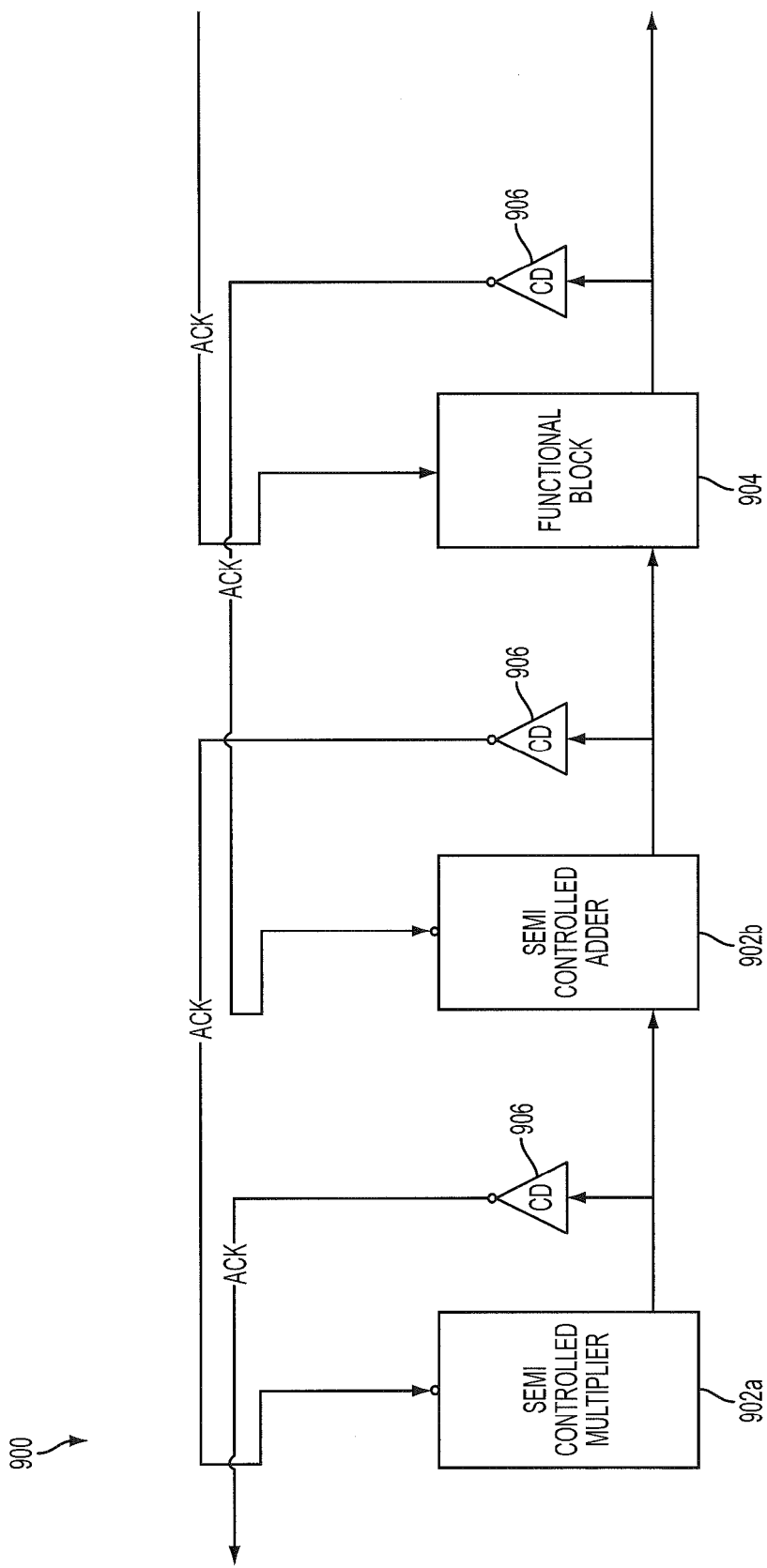
FIG. 9 is a schematic block diagram of an asynchronous pipeline structure having one or more semi-controlled stages in accordance with an exemplary embodiment.

Referring now to FIG. 9, there is shown a schematic block diagram of an asynchronous pipeline structure 900 having one or more semi-controlled stages 902a, 902b in accordance with an exemplary embodiment. A generic functional block 904 is also shown in the pipeline architecture 900, downstream of the semi-controlled stage 902b, as are completion detectors 906.

In a fully controlled digital circuit, there are both "footer" and "header" transistors. A header transistor serves as a gate which selectively couples pull-up devices (e.g., PFETs) to the high voltage rail, while a footer transistor serves as a gate which selectively couples pull-down devices (e.g., NFETs) to the low voltage rail. In contrast, a semi-controlled digital circuit, such as the exemplary multiplier 902a and the adder 902b of FIG. 9, includes either a footer or a header, but not both. An advantage of a semi-controlled digital circuit in this regard is faster operation.

Figure 10:
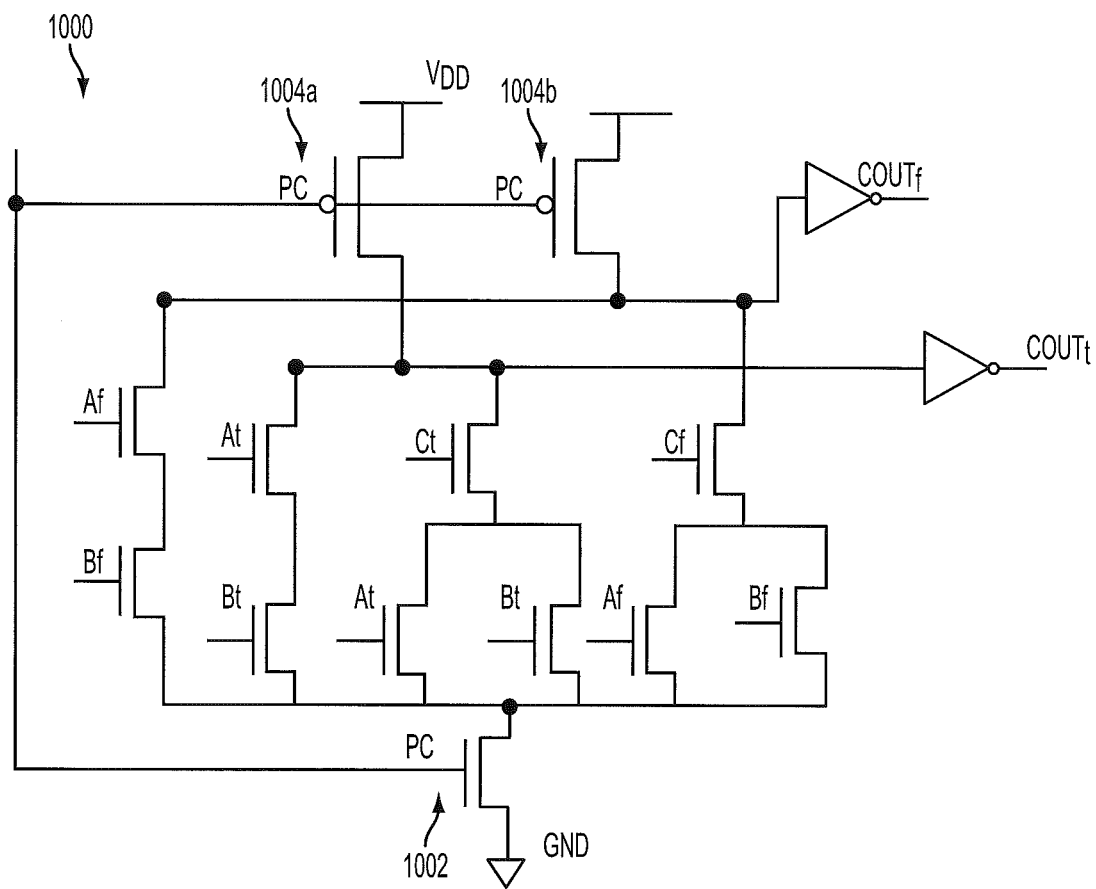
FIG. 10 is a schematic diagram of a fully controlled circuit.
Figure 11:
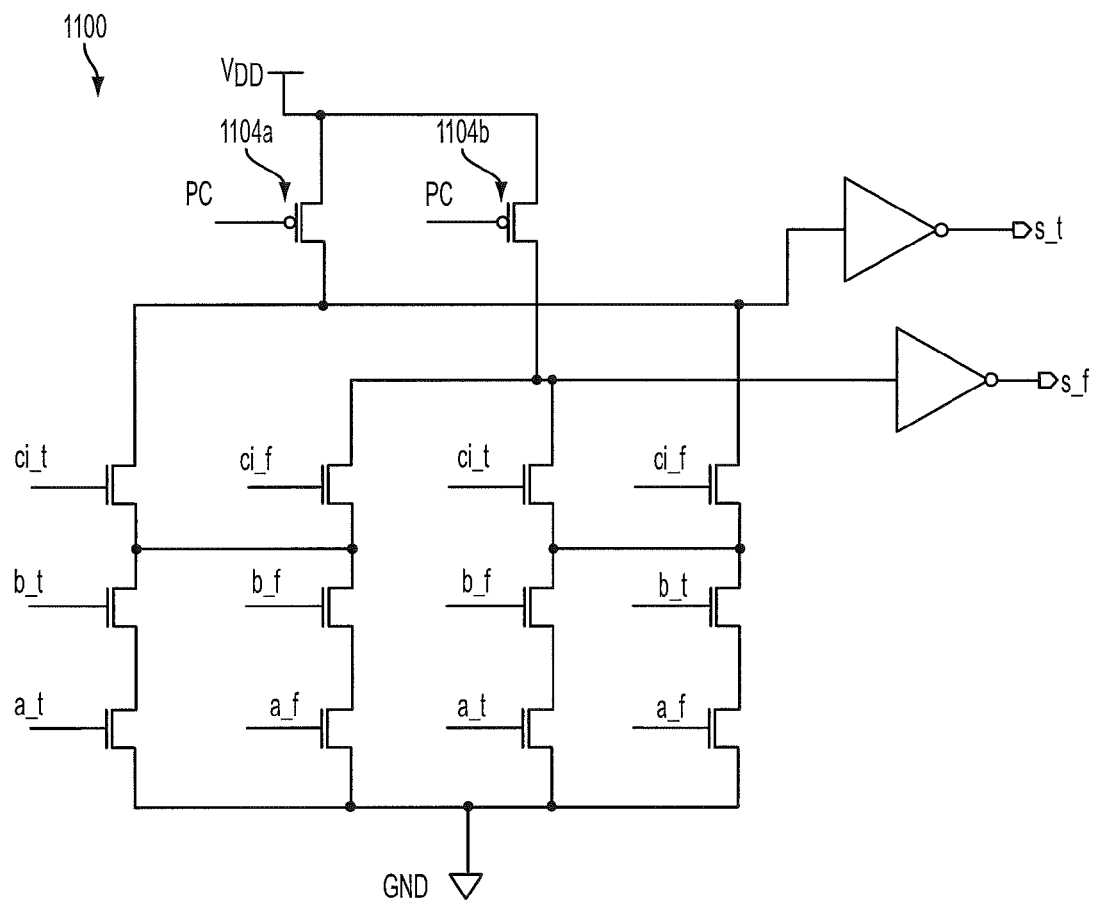
FIG. 11 is a schematic diagram of a semi controlled circuit, such as depicted in FIG. 9.

FIG. 10 is a schematic diagram of a fully controlled digital circuit 1000, in which it will be seen that a control signal (PC) is coupled to both an NFET footer transistor 1002, as well as a pair of PFET header transistors 1004a, 1004b. This circuit design results in a slower computation time due to the extra transistor present (either NFET 1002 or PFETs 1004a, 1004b) between the voltage supply rails and the digital output signals, $Cout_t$, $Cout_f$. In contrast, FIG. 11 is a schematic diagram of a semi-controlled digital circuit 1100 that includes a pair of PFET header transistors 1104a, 1104b, but without a footer transistor. The presence of a footer transistor would prevent a direct path from $V_{DD}$ to ground in the event valid inputs arrive at the NFET gates while the circuit is still in a precharge mode. Such a condition could occur, for example, in the event a sum block is stalled for a complete cycle. However, even if this condition occurs, the net effect is extra power burned which is equivalent to current mode output logic.

Referring once again to FIG. 9, the exemplary semi-controlled multiplier 902a and semi-controlled adder 902b are included in the asynchronous pipeline structure 900 that has an odd number of pipeline stages. This particular architecture of an odd number of asynchronous data flow stages has a unique timing property that provides the benefit of having fewer transistors with semi-controlled logic, but without the disadvantage of potentially having a short circuit leakage path as the datapath circuits are always in a low leakage state after a computation.

The assumption here is that each pipeline consists of two functional blocks that take inputs from multiple sources, such as an adder or multiplier, and the rest of the pipeline consists of elements that only take inputs from one source such as a latch. FIG. 9 depicts the first stage as a semi-controlled multiplier, the second stage a semi-controlled adder, and the third stage is a latch element: this could either be an identity or Z-element for example. A short circuit condition can be caused in a semi-controlled functional block that uses only a header transistor if the pre-charge PC input is set low so that the pull-up (PMOS) transistor network is activated and at the same time, inputs arrive a, b, and c, such that the pull down transistor network (NMOS) is also turned on. This condition would occur if an even number of latch elements were present downstream, since it is impossible for a latch to stall due to multiple inputs.

With an even number of latches downstream from a multi-input element, such as the adder in FIG. 9, when the adder evaluates valid data, the latches will continue to cycle such that eventually the latch downstream from the adder will give the adder a high PC value. If the other input to the adder should stall, the adder will continue to give a low PC value to the stage before it, the multiplier in FIG. 9. The first stage in the pipeline (the multiplier in this case) will be stalled then with a low PC value where eventually valid inputs will arrive also activating the pull down network, stalling it into a short circuit state. To prevent this, an odd number of latches is used so that a stalled multi-input element would cause the PC value of its predecessor to be held high, mitigating the short circuit condition. They will continue to cycle, since a stall is impossible. An even number of latches that are cascaded are able to reset each other, thus sending back an ack signal causing a multi-input element up stream to have a low PC input, meanwhile having activated inputs as in the condition described above.

As will thus be appreciated, among the technical benefits of the above described embodiments are the improvement of power consumption in asynchronous pipeline architectures using asynchronous techniques and digital computer circuits that run faster, and with less leakage current.

While the disclosure has been described with reference to a preferred embodiment or embodiments, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the disclosure not be limited to the particular embodiment disclosed as the best mode contemplated for carrying out this disclosure, but that the disclosure will include all embodiments falling within the scope of the appended claims.

The invention claimed is:

1. An asynchronous pipeline structure, comprising:
a plurality of functional blocks comprising dynamic logic, each functional block configured to be precharged to an idle state responsive to a precharge control signal applied thereto, with each functional block further configured to, upon being precharged, receive input data thereto for processing, and each functional block configured to hold output data generated thereby during an evaluate phase, independent of a reset of the input data;
for each functional block, a completion detector circuit coupled to the output of the functional block, the completion detector circuit configured to generate an acknowledgement signal that indicates validity or absence of data at the output of the functional block; and
for each functional block, a precharge control circuit configured to generate a precharge signal, wherein for a given functional block, a first input to the precharge control circuit comprises the acknowledgment signal from a downstream completion detector, and a second input to the precharge control circuit comprises the precharge signal from an upstream precharge control circuit;
wherein the precharge signal is independent of the acknowledgement signal of an upstream completion detector.

2. The asynchronous pipeline structure of claim 1, wherein the input and output data of the functional blocks comprise dual-rail data.

3. The asynchronous pipeline structure of claim 1, wherein the precharge control circuits comprise Muller-C elements.

4. The asynchronous pipeline structure of claim 3, wherein the Muller-C elements are asynchronous.

5. An asynchronous pipeline structure, comprising:
- a plurality of pipeline stages each including a functional block comprising dynamic logic, each functional block configured to be precharged to an idle state responsive to a precharge control signal applied thereto, with each functional block further configured to, upon being precharged, receive input data thereto for processing, and each functional block configured to hold output data generated thereby during an evaluate phase, independent of a reset of the input data;
- for each functional block, a completion detector circuit coupled to the output of the functional block, the completion detector circuit configured figured to generate an acknowledgement signal that indicates validity or absence of data at the output of the functional block; and
- at least one of the functional blocks comprising a semi-controlled digital circuit such that the digital circuit comprises only a PFET header transistor in series between a high voltage rail and input transistors as a gate device;
- wherein the precharge signal is independent of the acknowledgement signal of an upstream completion detector.

6. The asynchronous pipeline structure of claim 5, wherein the plurality of pipeline stages comprises an odd number.

\* \* \* \* \*